(12) United States Patent
Luo et al.

(10) Patent No.: US 11,715,685 B2
(45) Date of Patent: Aug. 1, 2023

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Shuangqiang Luo, Boise, ID (US); Indra V. Chary, Boise, ID (US); Nancy M. Lomeli, Boise, ID (US); Xiao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 17/064,453

(22) Filed: Oct. 6, 2020

(65) Prior Publication Data

US 2022/0108947 A1 Apr. 7, 2022

(51) Int. Cl.
*H01L 23/522* (2006.01)
*G11C 16/08* (2006.01)
(Continued)

(52) U.S. Cl.
CPC .......... *H01L 23/5226* (2013.01); *G11C 16/08* (2013.01); *G11C 16/24* (2013.01);
(Continued)

(58) Field of Classification Search
CPC ....... H01L 21/76831; H01L 21/76843–76846; H01L 2221/1073–1089; H01L 27/11273;
(Continued)

(56) References Cited

U.S. PATENT DOCUMENTS

| 9,673,213 B1 | 6/2017 | Yu et al. |
| 10,304,852 B1 | 5/2019 | Cui et al. |

FOREIGN PATENT DOCUMENTS

| KR | 10-2017-0022481 A | 3/2017 |
| WO | 2017/112014 A1 | 6/2017 |
| WO | 2020/073158 A1 | 4/2020 |

OTHER PUBLICATIONS

Billingsley et al., Microelectronic Devices Including Conductive Structures, and Related Memory Devices, Electronic Systems, and Methods, U.S. Appl. No. 16/943,826, filed Jul. 30, 2020.

(Continued)

*Primary Examiner* — Amar Movva
(74) *Attorney, Agent, or Firm* — TraskBritt

(57) ABSTRACT

A method of forming a microelectronic device includes forming a microelectronic device structure. The microelectronic device structure includes a stack structure comprising insulative structures and electrically conductive structures vertically alternating with the insulative structures, pillar structures extending vertically through the stack structure, an etch stop material vertically overlaying the stack structure, and a first dielectric material vertically overlying the etch stop material. The method further includes removing portions of the first dielectric material, the etch stop material, and an upper region of the stack structure to form a trench interposed between horizontally neighboring groups of the pillar structures, forming a liner material within the trench, and substantially filling a remaining portion of the trench with a second dielectric material to form a dielectric barrier structure.

17 Claims, 13 Drawing Sheets

(51) Int. Cl.
*G11C 16/24* (2006.01)
*H01L 21/768* (2006.01)
*H10B 41/10* (2023.01)
*H10B 41/27* (2023.01)
*H10B 41/35* (2023.01)
*H10B 41/41* (2023.01)
*H10B 43/10* (2023.01)
*H10B 43/27* (2023.01)
*H10B 43/35* (2023.01)
*H10B 43/40* (2023.01)

(52) U.S. Cl.
CPC ....... *H01L 21/76831* (2013.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02)

(58) Field of Classification Search
CPC ........... H01L 27/1128; H01L 27/11514; H01L 27/11551; H01L 27/11553; H01L 27/11556; H01L 27/11578; H01L 27/1158; H01L 27/11582; H01L 27/11597; H01L 27/2481; H01L 27/249; H10B 20/40–65; H10B 53/20; H10B 41/20–27; H10B 43/20–27; H10B 51/20; H10B 63/84–845
See application file for complete search history.

(56) References Cited

OTHER PUBLICATIONS

Hu et al., Microelectronic Devices Including Contact Structures, and Related Electronical Systems and Methods, U.S. Appl. No. 16/877,233, filed May 18, 2020.
International Search Report for Application No. PCT/US2021/052214, dated Jan. 18, 2021, 3 pages.
Written Opinion of the International Searching Authority for Application No. PCT/US2021/052214, dated Jan. 18, 2022, 5 pages.

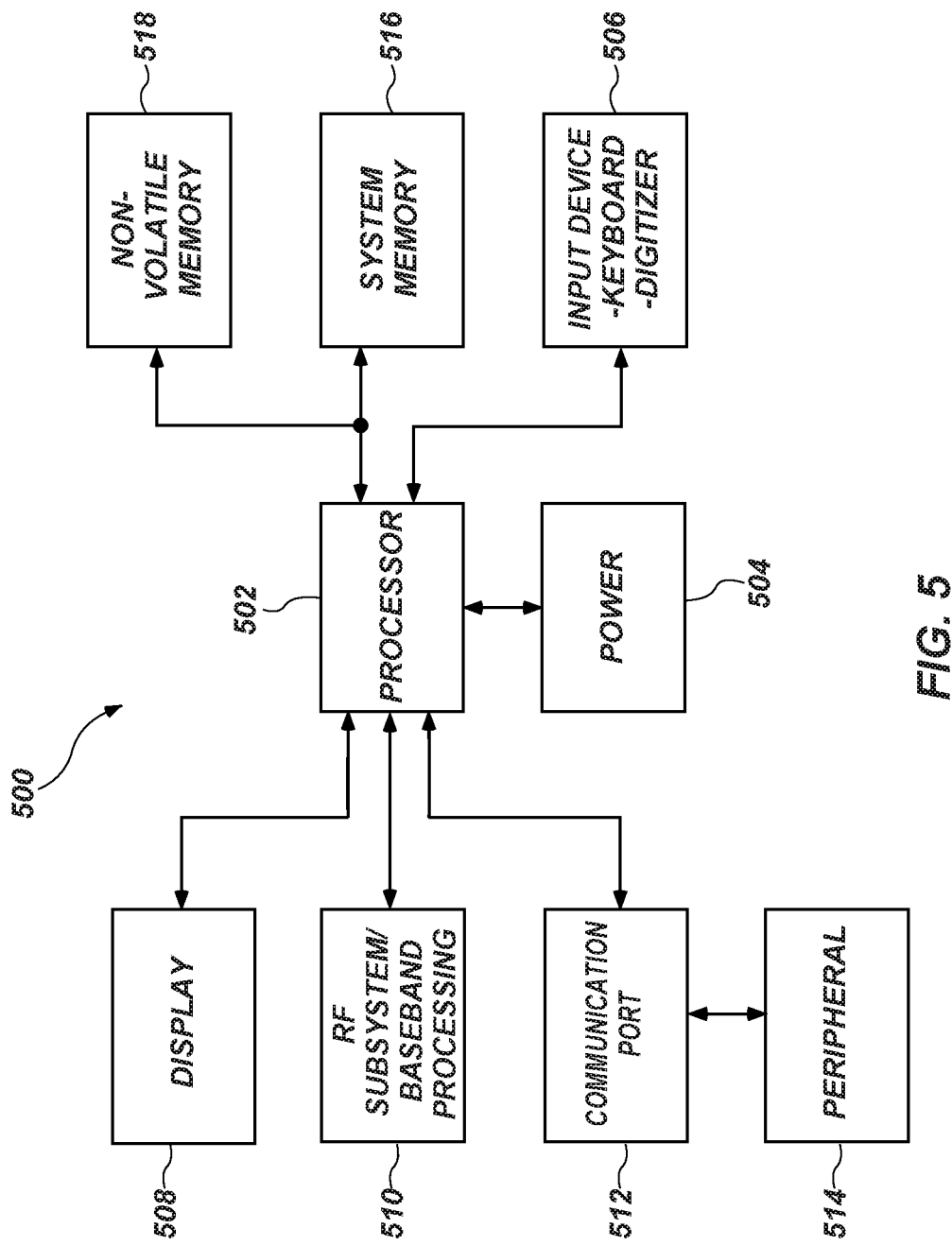

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As vertical memory array technology has advanced, enhanced memory density has been provided by forming memory devices to exhibit multiple deck (e.g., dual deck) configurations. For example, in one conventional dual deck configuration, some vertical memory strings are located in an upper deck (e.g., an upper stack structure), and additional vertical memory strings are located in a lower deck (e.g., a lower stack structure) underlying the upper deck. The vertical memory strings of the upper deck may be electrically coupled to the additional vertical memory strings of the lower deck (e.g., by way of conductive interconnect structures), or the vertical memory strings of the upper deck may be electrically isolated from the additional vertical memory strings of the lower deck (e.g., by way of an intervening dielectric material). Unfortunately, as feature packing densities have increased and margins for formation errors have decreased, conventional memory device formation methods and associated configurations and have resulted in undesirable stresses (e.g., access line contact over etch stresses), defects (e.g., access line contact punch through) and current leaks (e.g., select gate current leakage, access line current leakage) that can diminish desired memory device performance, reliability, and durability.

BRIEF DESCRIPTION OF THE DRAWINGS

FIG. 5 is a schematic block diagram of a processor-based system, in accordance with embodiments of the disclosure.

DETAILED DESCRIPTION

Figure 1A:
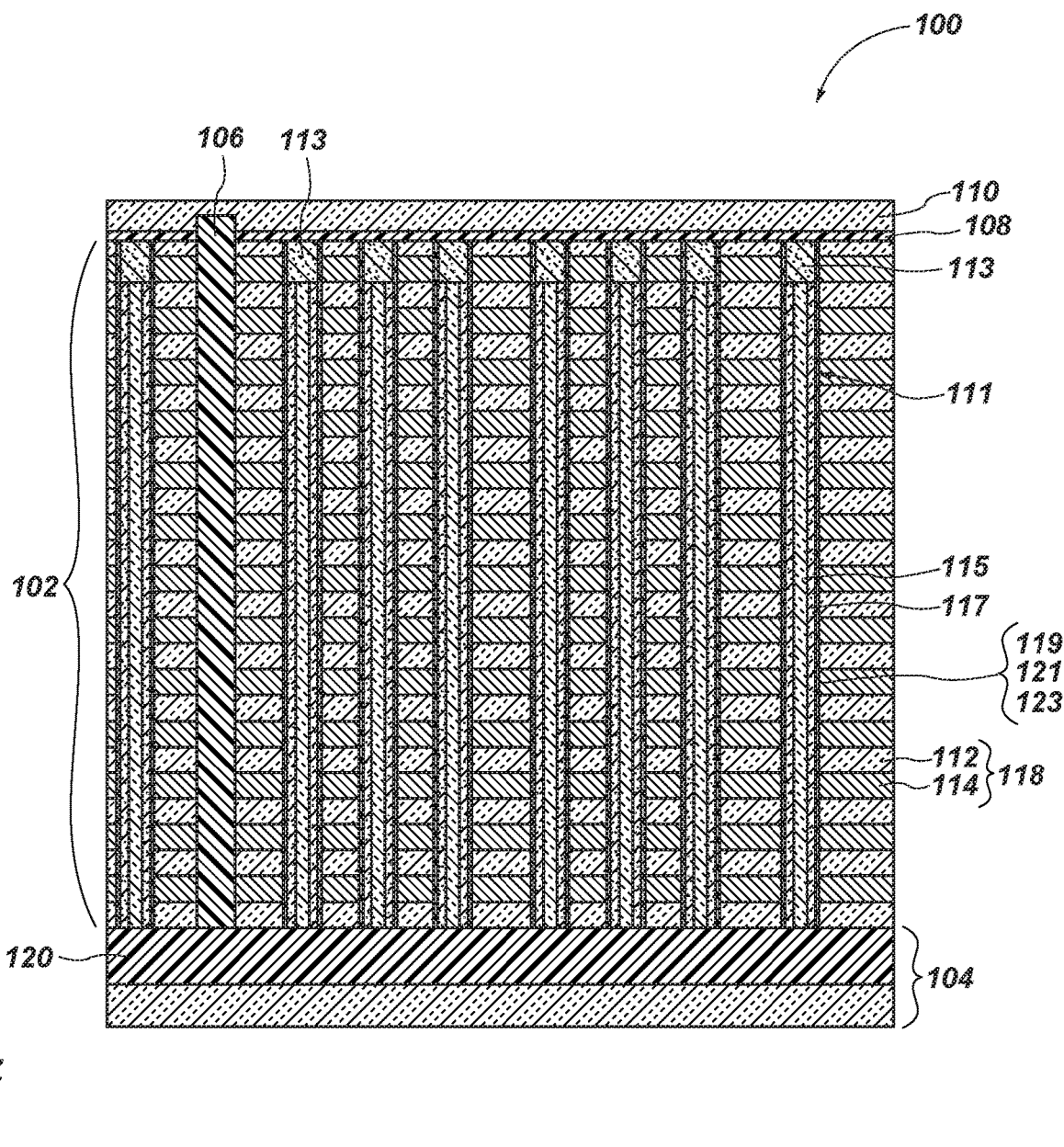
FIGS. 1A through 1G are a simplified, partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting memory functionality, but not necessary limited to memory functionality. Stated another way, and by way of non-limiting example only, the term "memory device" includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of at least one feature (e.g., at least one structure, at least one region, at least one apparatus) facilitating operation of the at least one feature in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, a material is "selectively etchable" relative to another material if the material exhibits an etch rate that is at least about five times (5×) greater than the etch rate of another material during exposure to the same etching agent (e.g., etchant), such as about ten times (10×) greater, about twenty times (20×) greater, or about forty times (40×) greater.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise. Etch chemistries and etch conditions for etching a desired material may be selected by a person of ordinary skill in the art.

Embodiments of the disclosure include microelectronic device structures for microelectronic devices (e.g., memory devices), as well as related microelectronic devices (e.g., memory devices), electronic systems, and method. In some embodiments, a microelectronic device structure of the disclosure includes a stack structure including a vertically alternating sequence of electrically conductive structures (e.g., gate structures) and electrically insulating structures arranged in tiers. The microelectronic device structure may further include pillar structures extending vertically through the tiers of the stack structure and trenches vertically extending through an upper portion of the stack structure (e.g., a portion of the stack structure defining upper select gates (e.g., drain side select gates (SGDs))) of the microelectronic device structure. Each of the trenches may be formed between a respective set of neighboring pillar structures of the pillar structures. The microelectronic device structure may further include a liner material formed over at least vertically extending sidewalls of the stack structure defining the trenches, and a dielectric material formed within and a least partially (e.g., substantially) filling remaining portions of the trenches not occupied by the liner material. The dielectric material may form a dielectric barrier structure. In some embodiments, the liner material includes a dielectric nitride material (e.g., silicon nitride), and the dielectric material include a dielectric oxide material (e.g., silicon oxide, aluminum oxide).

The liner material may provide a barrier between the electrically conductive structures of the stack structure and the dielectric material within the filled trenches. Furthermore, because the liner material is disposed between the electrically conductive structures and the dielectric material, the liner material may at least partially prevent the electrically conductive structures from oxidizing due to contact with the dielectric material. For instance, the liner material may at least partially prevent tungsten of the electrically conductive structures from oxidizing due to contact with oxide material of the dielectric structure. Accordingly, the liner material may prevent oxidation of drain side select gates (SGDs) of the microelectronic device structure, which may improve exhibited effective threshold voltages of the microelectronic device structure.

Additionally, the liner material may reduce a likelihood of material of subsequently formed contact structures (e.g., digit line contacts) "falling off" other portions of the microelectronic device structure, leaking into the trenches, and contacting the electrically conductive structures (e.g., word lines). When material of the contact structures leaks into the trenches (referred to hereinafter as "falloff") and contacts the electrically conductive structures (e.g., word lines), the resulting contact can cause undesirable current leakage and short circuits. Because the liner material (e.g., a stop material) is formed at the boundary of the trenches and between the dielectric material and the electrically conductive structures, the liner material may prevent falloff of the material of the contact structures, or, in the event of falloff of the material of the contact structures, the liner material may prevent the material of the contact structures from contacting the electrically conductive structures.

Furthermore, the liner material can reduce a likelihood of voids within the tiers of the stack structure causing blowouts (e.g., ruptures within the microelectronic device due to pressure within the voids) and/or materials of the tiers outgassing (e.g., releasing or giving off (a substance) as a gas or vapor) and causing blowouts. In particular, the liner material may reduce any interaction between the dielectric layer and the materials of the tiers, which may reduce the likelihood of outgassing and blowouts during formation of the insulative.

In view of the foregoing, the liner material may reduce defects within and improve performance of the microelectronic device structure, as well as of microelectronic devices and electronic systems including the microelectronic device structure. By reducing defects and improving performance, the liner material and configuration of the microelectronic device structure described herein may improve yield.

FIGS. 1A-1G are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein may be used for and in various devices and electronic systems.

FIG. 1A shows a microelectronic device structure 100 according to one or more embodiments of the disclosure. The microelectronic device structure 100 may represent a structure post (e.g., subsequent to) one or more replacement gate processes. For example, the microelectronic device structure 100 may include a structure formed during so called "replacement gate" or "gate last" processing acts, which are known in the art and include, for instance, at least partially replacing sacrificial materials (e.g., dielectric material, such as dielectric nitride material) of sacrificial structures with one or more electrically conductive materials (e.g., at least one metal, such as tungsten (W)). Replacement gate processing acts may include selectively removing (e.g., selectively etching and/or exhuming) portions of the sacrificial structures of a preliminary stack structure through slots formed in the preliminary stack structure, and the filling the resulting void spaces with conductive material (e.g., W) to form the electrically conductive structures. As is described herein, some of the electrically conductive structures may function as access line structures (e.g., word line structures) for the microelectronic device structure 100, and some of the electrically conductive structures may function as select gate structures for the microelectronic device structure 100. At least one lower conductive structure of the resulting modified stack structure may be employed as at least one lower select gate (e.g., at least one source side select gate (SGS)) of the microelectronic device structure 100. In some embodiments, a single (e.g., only one) conductive structure of a vertically lowermost tier of the modified stack structure is employed as a lower select gate (e.g., a SGS) of the microelectronic device structure 100. In addition, upper conductive structures of the modified stack structure may be employed as upper select gates (e.g., drain side select gates (SGDs)) of the microelectronic device structure 100. In some embodiments, horizontally neighboring conductive structures of one or more vertically upper tiers of the modified stack structure are employed as upper select gates (e.g., SGDs) of the microelectronic device structure 100.

The microelectronic device structure 100 may be formed to include a stack structure 102, a source tier 104 under the stack structure 102, a dielectric structure 106 (e.g., a dielectric material deposited within a previous slot utilized during so called "replacement gate" or "gate last" processing acts) extending into the stack structure 102, a etch stop material 108 on or over the stack structure 102 and the dielectric structure 106, and a dielectric material 110 on or over the etch stop material 108. The microelectronic device structure 100 may further include pillar structures 111 extending vertically (e.g., in the Z-direction) through at least a portion of the microelectronic device structure 100. The pillar structures 111 are described in greater detail below.

The stack structure 102 includes a vertically alternating (e.g., in the Z-direction) sequence of insulative structures 112 and electrically conductive structures 114 (e.g., gate structures, word lines) arranged in tiers 118. Each of the tiers 118 of the stack structure 102 may include at least one of the insulative structures 112 vertically neighboring at least one of the electrically conductive structures 114. The stack structure 102 may include a desired quantity of the tiers 118. For example, the stack structure 102 may include greater than or equal to ten (10) of the tiers 118, greater than or equal to twenty-five (25) of the tiers 118, greater than or equal to fifty (50) of the tiers 118, greater than or equal to one hundred (100) of the tiers 118, greater than or equal to one hundred and fifty (150) of the tiers 118, or greater than or equal to two hundred (200) of the tiers 118 of the insulative structures 112 and the electrically conductive structures 114.

The insulative structures 112 of the tiers 118 of the stack structure 102 may be formed of and include at least one electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulative structures 112 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the insulative structures 112 are formed of and include $SiO_x$ (e.g., $SiO_2$).

Each of the insulative structures 112 may individually include a substantially homogeneous distribution of the at least one electrically insulative material, or a substantially heterogeneous distribution of the at least one electrically insulative material. In some embodiments, each of the insulative structures 112 is substantially homogeneous. In additional embodiments, at least one of the insulative structures 112 substantially heterogeneous. The insulative structure 112 may, for example, be formed of and include a stack (e.g., laminate) of at least two different electrically insulative materials. The insulative structures 112 of each of the tiers 118 of the stack structure 102 may each be substantially planar, and may each individually exhibit a desired thickness.

The electrically conductive structures 114 of each of the tiers 118 of the stack structure 102 may include electrically conductive materials. For instance, as noted above, the electrically conductive structures 114 may include tungsten (W). In additional embodiments, the electrically conductive structures may include titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively doped silicon, conductively doped germanium, conductively doped silicon germanium), polysilicon, other materials exhibiting electrical conductivity, or combinations thereof. The electrically conductive structures 114 may be substantially homogeneous, or may be substantially heterogeneous. In some embodiments, the electrically conductive structures 114 are substantially homogeneous. In additional embodiments, the electrically conductive structures 114 are substantially heterogeneous. The electrically conductive structures 114 of each of the tiers 118 of the stack structure 102 may each be substantially planar, and may each individually exhibit a desired thickness.

The source tier 104 vertically underlies (e.g., in the Z-direction) the stack structure 102 and includes at least one source structure 120 (e.g., a source plate). The source structure 120 may be formed of and include at least one electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), and a conductive metal-containing material (e.g., a conductive metal nitride, a conductive metal silicide, a conductive metal carbide, a conductive metal oxide). In some embodiments, the source tier 104 may include the at least one source structure 120 and one or more discrete structures.

Referring still to FIG. 1A, the etch stop material 108 may be formed on or over an uppermost tier 118 of the stack structure 102. In some embodiments, the etch stop material 108 is formed to extend substantially continuously on and across uppermost surfaces of the stack structure 102 and the dielectric structure 106. The etch stop material 108 may be formed of and include, for example, a material exhibiting an etch selectivity with respect to the dielectric material 110 and/or the insulative structures 112. In some embodiments, the etch stop material 108 may include a carbon-containing material. For example, the etch stop material 108 may include carbon nitride (CN) or silicon carbon nitride (SiCN). In some such embodiments, the etch stop material 108 may facilitate an improved electric field through channel regions (e.g., channel materials within the pillar structures 111) proximate the etch stop material 108 during use and operation of the microelectronic device structure 100. In some embodiments, the microelectronic device structure 100 does not include the etch stop material 108 between the stack structure 102 and the dielectric material 110. In one or more embodiments, as is described in greater detail below, the etch stop material 108 serves as an etch stop during the subsequent formation of contact structures.

With continued reference to FIG. 1A, the dielectric material 110 may be formed on or over a surface of the etch stop material 108. In some embodiments, the dielectric material 110 is formed to extend substantially continuously on and across an uppermost surface of the etch stop material 108.

The dielectric material 110 may be formed of and include at least one dielectric material. A material composition of the dielectric material 110 may be different than a material composition of the etch stop material 108 and may include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric material 110 is formed of and includes $SiO_x$ (e.g., $SiO_2$). The dielectric material 110 may be substantially homogeneous, or may be substantially heterogeneous. In some embodiments, the dielectric material 110 is substantially homogeneous. In additional embodiments, the dielectric material 110 is substantially heterogeneous. The dielectric material 110 may be substantially planar, and may exhibit a desired thickness.

Referring still to FIG. 1A, as mentioned above, the microelectronic device structure 100 may include pillar structures 111 (e.g., cell pillars) extending vertically (e.g., in the Z-direction) partially through the stack structure 102. In some embodiments, the pillar structures 111 may extend vertically from uppermost electrically conductive structure 114, through the stack structure 102, and to the source tier 104. The pillar structures 111 may contact the at least one source structure 120. Intersections of the pillar structures 111 and the electronically conductive structures may form string of memory cells vertically extending through the stack structure 102.

The pillar structures 111 may each individually comprise an insulative material 115, a channel material 117 horizontally neighboring the insulative material 115, a tunnel dielectric material (also referred to as a "tunneling dielectric material") 119 horizontally neighboring the channel material 117, a memory material 121 horizontally neighboring the tunnel dielectric material 119, and a dielectric blocking material (also referred to as a "charge blocking material") 123 horizontally neighboring the memory material 121. A combination of the tunnel dielectric material 119, the memory material 121, and the dielectric blocking material are depicted a single material in the figures. The dielectric blocking material 123 may horizontally neighbor the tiers 118 of the stack structure 102. The channel material 117 may be horizontally interposed between the insulative material 115 and the tunnel dielectric material 119; the tunnel dielectric material 119 may be horizontally interposed between the channel material 117 and the memory material 121; the memory material 121 may be horizontally interposed between the tunnel dielectric material 119 and the dielectric blocking material 123; and the dielectric blocking material 123 may be horizontally interposed between the memory material 121 and the tiers 118 of the stack structure 102.

The insulative material 115 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 115 comprises silicon dioxide.

The channel material 117 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 117 is formed of and includes silicon (e.g., monocrystalline silicon, polycrystalline silicon). In some embodiments, the channel material 117 may be doped (e.g., with an N-type dopant, with a P-type dopant), or may be substantially undoped (e.g., substantially free of N-type dopants and P-type dopants). In additional embodiments, the channel material 117 is formed of and includes an oxide semiconductive material having a band gap larger than that polycrystalline silicon, such as a band gap larger than 1.65 electronvolts (eV). By way of non-limiting example, the channel material 117 may be formed of and include one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. The channel material 117 may be substantially homogeneous, or the channel material 117 may be heterogeneous.

The tunnel dielectric material 119 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 119 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 119 comprises silicon dioxide. In other embodiments, the tunnel dielectric material 119 comprises silicon oxynitride.

The memory material 121 may comprise a charge trapping material or a conductive material. The memory material 121 may be formed of and include one or more of silicon nitride, silicon oxynitride, polysilicon (e.g., doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 121 comprises silicon nitride.

The dielectric blocking material 123 may be formed of and include a dielectric material such as, for example, one or more of a dielectric oxide (e.g., silicon dioxide), a dielectric nitride (e.g., silicon nitride), and an dielectric oxynitride (e.g., silicon oxynitride), or another material. In some embodiments, the dielectric blocking material 123 comprises silicon oxynitride.

In some embodiments, the tunnel dielectric material 119, the memory material 121, and the dielectric blocking material 123 together may comprise a structure configured to trap a charge, such as, for example, an oxide-nitride-oxide (ONO) structure. In some such embodiments, the tunnel dielectric material 119 comprises silicon dioxide, the memory material 121 comprises silicon nitride, and the dielectric blocking material 123 comprises silicon dioxide.

The stack structure 102 may further include conductive plugs 113 coupled to (e.g., electrically contacting, physically contacting) the pillar structures 111. As is described in greater detail below, the conductive plugs 113 may form conductive connections between the pillar structures 111 and contact structures (e.g., bit line contacts, array contacts) (FIG. 1G). In some embodiments, the conductive plugs 113 may extend from the etch stop material 108, at least partially through the upper most tier 118 of the stack structure 102, and to uppermost surfaces of the pillar structures 111. In some embodiments, the conductive plugs 113 include conductively doped polycrystalline silicon.

The stack structure 102 (including the tiers 118 thereof), the source tier 104, the etch stop material 108, the dielectric material 110, the pillar structures 111, and the conductive plugs 113 may be formed using conventional processes (e.g., conventional material deposition processes, conventional photolithography processes, conventional material removal processes) and conventional processing equipment, which are not described in detail herein.

Figure 1B:
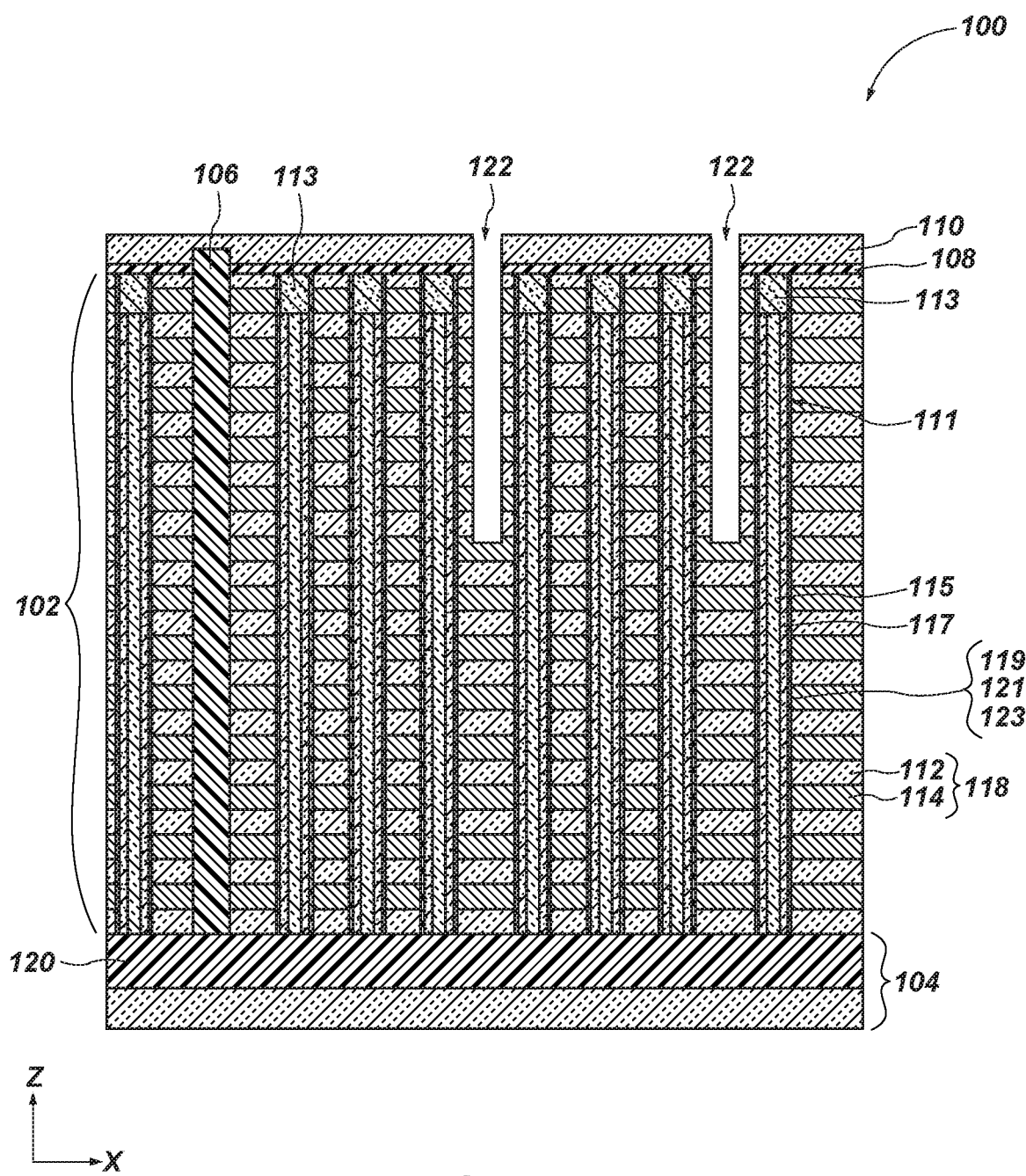

Referring next to FIG. 1B, portions of the dielectric material 110, the etch stop material 108, and the stack structure 102 may be removed to form trenches 122 (e.g., slots, slits, openings). In some embodiments, the trenches 122 may be patterned according to an array. For example, each of the trenches 122 may be formed between sets (e.g., groups) of neighboring pillar structures 111 of the pillar structures 111. The trenches 122 may vertically extend (e.g., in the Z-direction) through the dielectric material 110, the etch stop material 108, and one or more (e.g., two or more) of upper tiers 118 of the stack structure 102. The trench 122 may disrupt (e.g., terminate) the horizontal continuity of the etch stop material 108, the dielectric material 110, the insulative structures 112 of the upper tiers 118, and the electrically conductive structures 114 of the upper tiers 118. The trenches 122 may vertically extend through a portion of the stack structure 102 forming upper select gates (SGDs) of the microelectronic device structure. The trenches 122 may terminate (e.g., end) at upper surfaces of an electrically conductive structure 114 of a given tier 118. For example, lower vertical boundaries of the trenches 122 may be substantially coplanar with upper surfaces of electrically conductive structures 114 of the given tier 118 of the stack structure 102. In other embodiments, the trenches 122 may extend at least partially into the electrically conductive structures 114 of the upper tiers 118 of the stack structure 102, and may terminate within the vertical boundaries of the electrically conductive structures 114, as depicted in FIG. 1B. In some embodiments, each of the trenches 122 extends to substantially the same vertical depth as each other of the trenches 122.

In some embodiments, a width (e.g., critical dimension) of each of the trenches 122 is selected to achieve a desired dielectric constant (e.g., relative permittivity) of the microelectronic device structure 100. In particular, as is discussed in greater detail below in regard to FIG. 1C, the trenches 122 are ultimately lined with a liner material 125 (e.g., a nitride material) and otherwise filled with a dielectric material 129 (e.g., an oxide structure) (FIG. 1E), and due to the dielectric constant difference between the liner material 125 and the dielectric material 129, a width (e.g., critical dimension) of the liner material 125 and a width of the dielectric material 129 may be selected to achieve a desired dielectric constant of the microelectronic device structure 100. As a non-limiting example, a trench width may be increased based on a desired thickness (e.g., width) of the liner material 125 to permit a larger width of the dielectric material 129. In some embodiments, increasing the width of individual trenches 122 may affect earlier processes including formation of the pillar structures 111. For example, a distance (e.g., critical dimension) between neighboring pillar structures 111 may be increased to permit subsequent formation of the trenches 122, the liner material 125, and the dielectric material 129.

The trenches 122 may be formed to exhibit a desired horizontal cross-sectional shape and desired horizontal dimensions (e.g., width, length). In some embodiments, each of the trenches 122 is formed to exhibit an oblong horizontal cross-sectional shape (e.g., a rectangular cross-sectional shape, an ovular cross-sectional shape). A horizontal dimension (e.g., width) of each of the trenches 122 in a first horizontal direction (e.g., the X-direction) may be less than another horizontal dimension (e.g., length) of the trench 122 is a second horizontal direction (e.g., a direction orthogonal to the X-direction (e.g., a Y-direction)). Each of the trenches 122 may substantially horizontally partition (e.g., substantially horizontally divide) the etch stop material 108, the dielectric material 110, the insulative structures 112 of upper tiers 118 of the stack structure 102, and the electrically conductive structures 114 of the upper tiers 118 of the stack structure 102.

The trenches 122 may be formed using conventional processes, such as conventional material removal processes (e.g., conventional etching processes, such as conventional dry etching processes) and conventional processing equipment, which are not described in detail herein. By way of non-limiting example, the dielectric material 110, the etch stop material 108, and upper portions of the stack structure 102 may be subjected to anisotropic etching (e.g., anisotropic dry etching, such as one or more of reactive ion etching (RIE), deep RIE, plasma etching, reactive ion beam etching, and chemically assisted ion beam etching or anisotropic wet etching) to form the trenches 122.

Figure 1C:
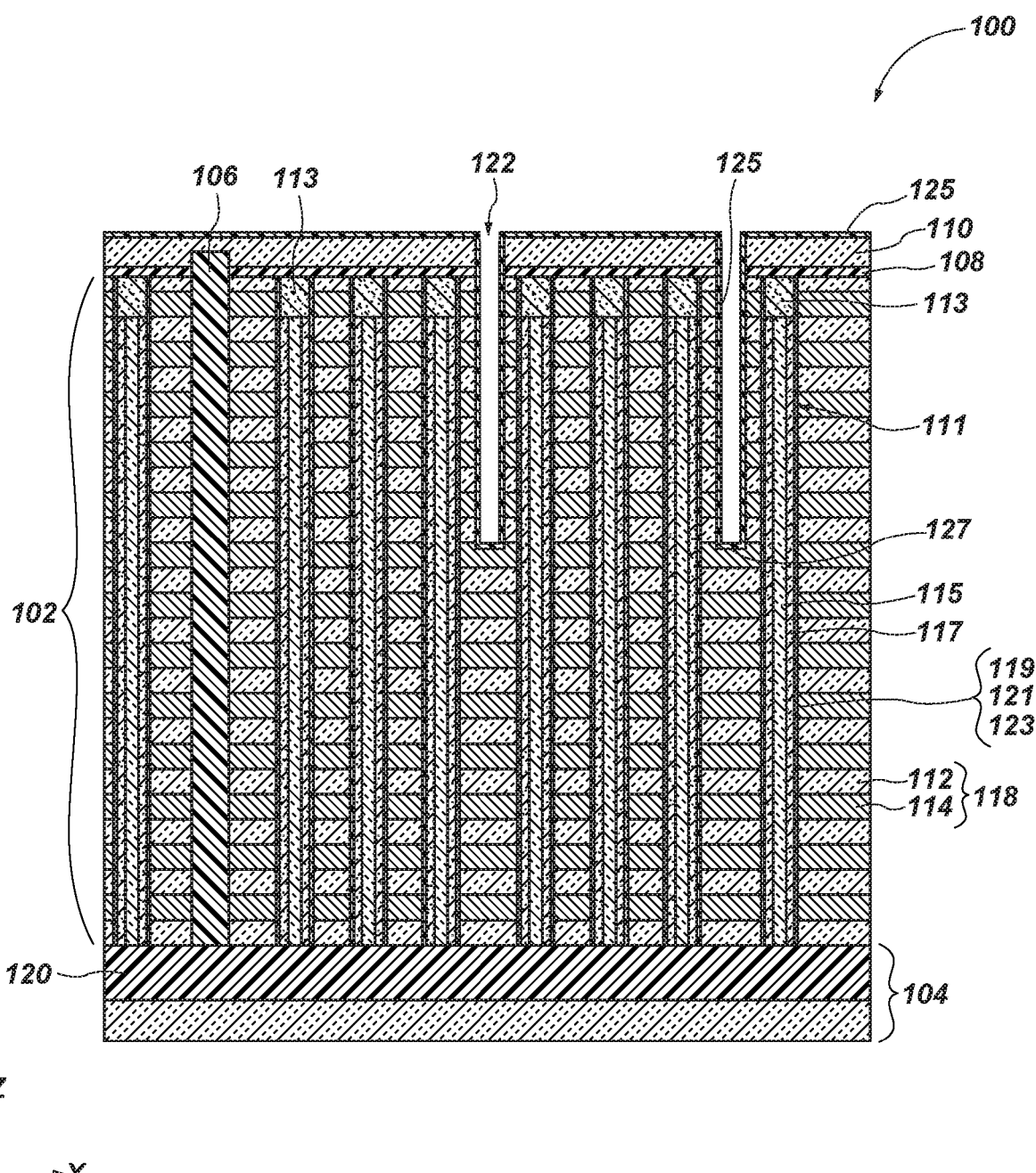
Figure 1D:
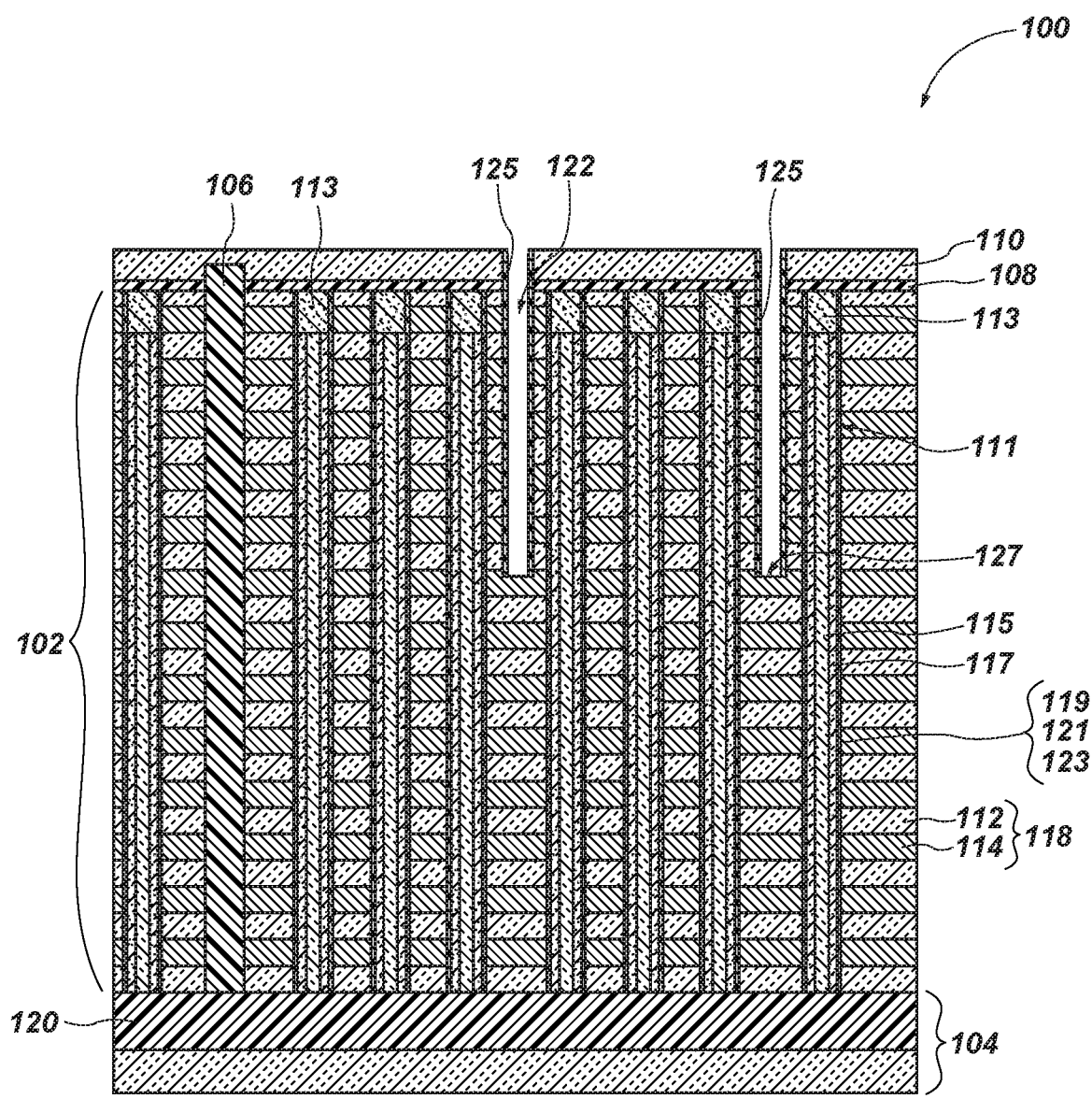

Referring to FIG. 1C, a liner material 125 may be formed on or over surfaces of the dielectric material 110 and portions of upper tiers 118 of the stack structure 102 defining the trenches 122. In some embodiments, forming the liner material 125 comprises conformally forming the liner material 125. For instance, the liner material 125 may be formed conformally over exposed surfaces of the dielectric material 110 and the stack structure 102.

The liner material 125 may be formed using, for example, one or more of atomic layer deposition (ALD), chemical vapor deposition (CVD), low pressure chemical vapor deposition (LPCVD), and plasma-enhanced chemical vapor deposition (PECVD). A thickness of the liner material 125 (e.g., height in the vertical direction and width in the horizontal direction of the liner material 125) may, for example, be within a range of from about 2 nanometers (nm) to about 30 nm, such as from about 3 nm to about 7 nm, or about 5 nm.

In some embodiments, the liner material 125 is formed of and includes dielectric material. For example, the liner material 125 may be formed of and include a dielectric nitride material. In some embodiments, the liner material 125 is formed of and includes $SiN_y$ (e.g., $Si_3N_4$). In additional embodiments, the liner material 125 is formed of and includes carbon nitride material. In further embodiments, the liner material 125 is formed of and includes one or more of dielectric oxynitride material (e.g., $SiO_xN_y$), dielectric carboxynitride material (e.g., $SiO_xC_zN_y$), aluminum oxide (e.g., $Al_2O_3$), or silicon oxycarbide ($SiO_xC_y$).

In some embodiments, the liner material 125 includes at least two materials (e.g., at least two liners, a bi-layer liner). For example, the liner material 125 may include a first liner including a silicon nitride material and a second liner including a carbon nitride material.

Figure 1E:
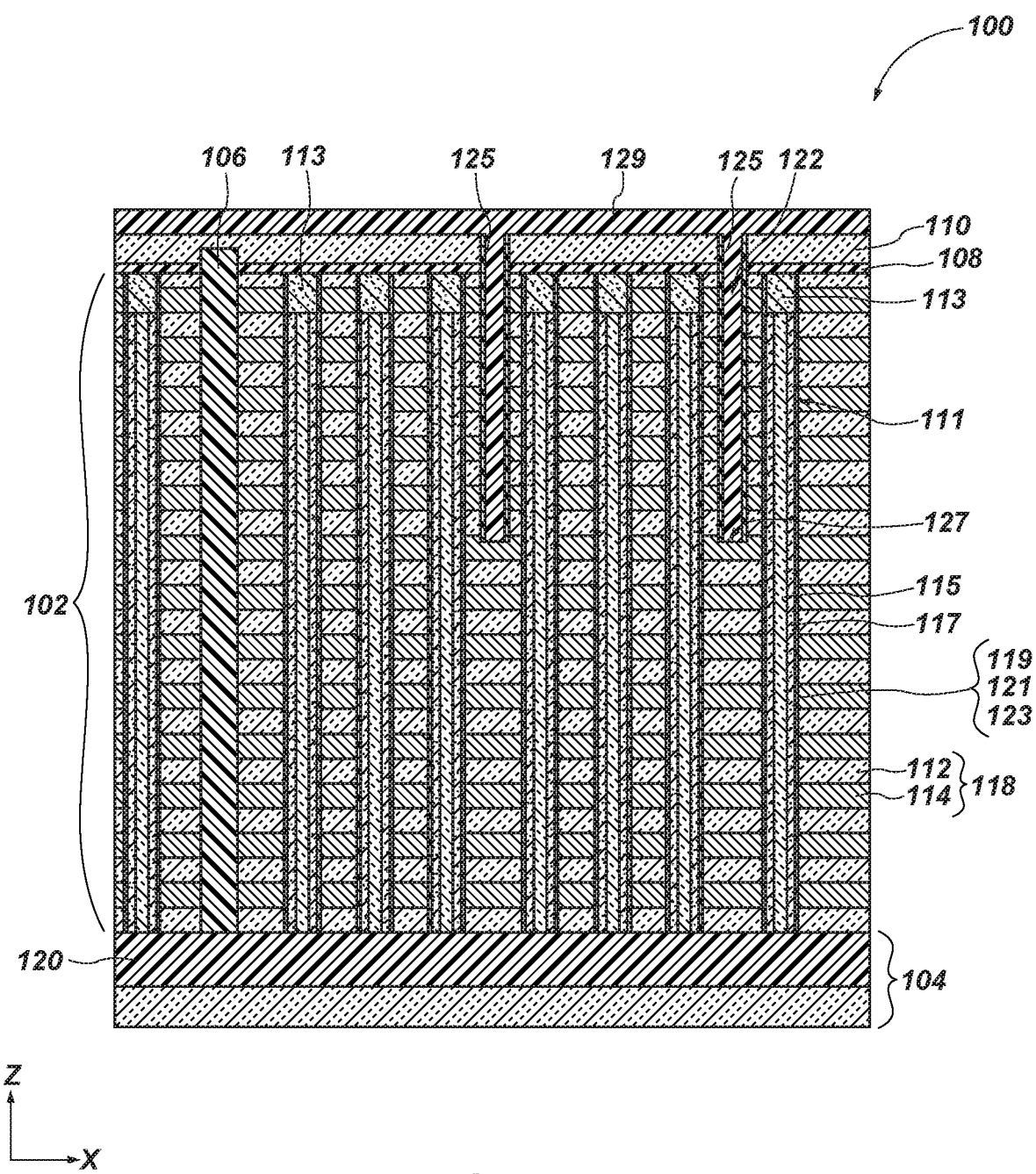

As is discussed in greater detail below, the liner material 125 may provide a barrier between the electrically conductive structures 114 and a subsequently formed dielectric material 129 (FIG. 1E). In some embodiments, because the liner material 125 is disposed between the electrically conductive structures 114 and a subsequently formed dielectric material 129 (FIG. 1E), the liner material 125 at least partially prevents the electrically conductive structures 114 from oxidizing due to contact with the subsequently formed dielectric material 129, which may include an oxide material. For instance, the liner material 125 may prevent the electrically conductive structures 114 from oxidizing due to contact with an oxidizing agent (e.g., oxide material of the subsequently formed dielectric material 129). Accordingly, the liner material 125 may prevent oxidation of SGDs of the microelectronic device structure 100, which may improve effective threshold voltages of the microelectronic device structure 100.

Referring to FIG. 1D, portions of the liner material 125 on horizontal surfaces, such as the upper surface of the dielectric material 110 and the horizontally extending surfaces 127 of the tiers 118 defining the trenches 122, may be removed. The portions of the liner material 125 may be removed by exposing the liner material 125 to a suitable etch chemistry. In some embodiments, the portions of the liner material 125 are removed by way of a directional etch process, such as, an anisotropic etch process (e.g., an anisotropic dry etch, an anisotropic wet etch). The portions of the liner material 125 may be removed without substantially removing the dielectric material 110 and materials of tiers 118 of the stack structure below the trenches 122. In some embodiments, the portions of the liner material 125 are removed using a cyclic (e.g., repetitive) etching process (e.g., a cyclic punch).

Referring to FIG. 1E, dielectric material 129 may be formed (e.g., deposited) within remaining (e.g., unfilled) portions of the trenches 122 and over the dielectric material 110. The trenches 122 may be at least substantially filled with dielectric material 129. In some embodiments, the dielectric material 129 comprise a spin-on dielectric material, and may be formed by a spin coating process. In additional embodiments, the dielectric material 129 may be formed using one or more of ALD, CVD, PVD, LPCVD, PECVD, and another deposition method. In some embodiments, the dielectric material 129 is formed of and includes at least one dielectric oxide material. For example, the dielectric material 129 may include one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, $MgO_x$, and a high-aspect-ratio process (HARP) oxide.

Figure 1F:
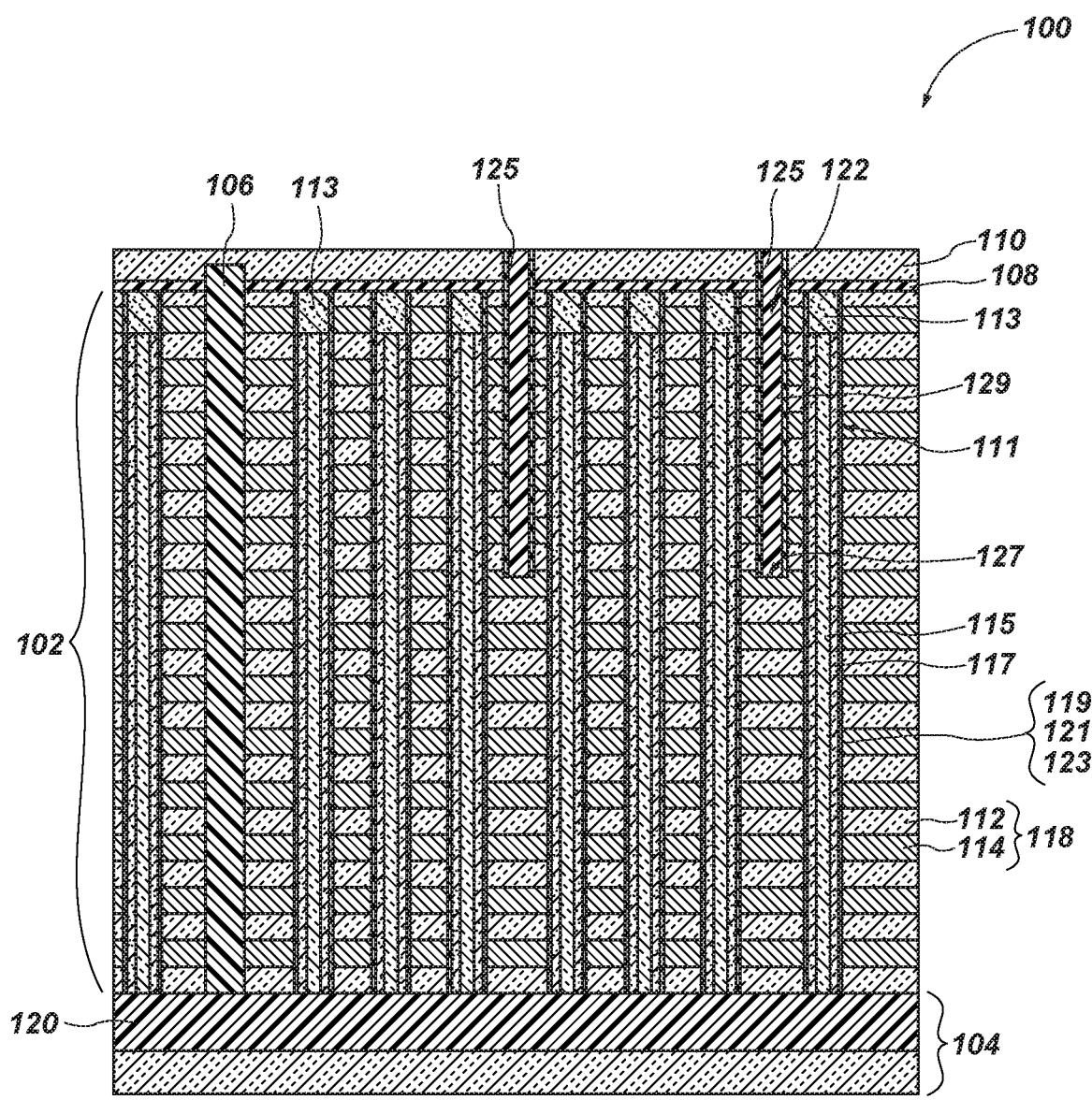
Figure 1G:
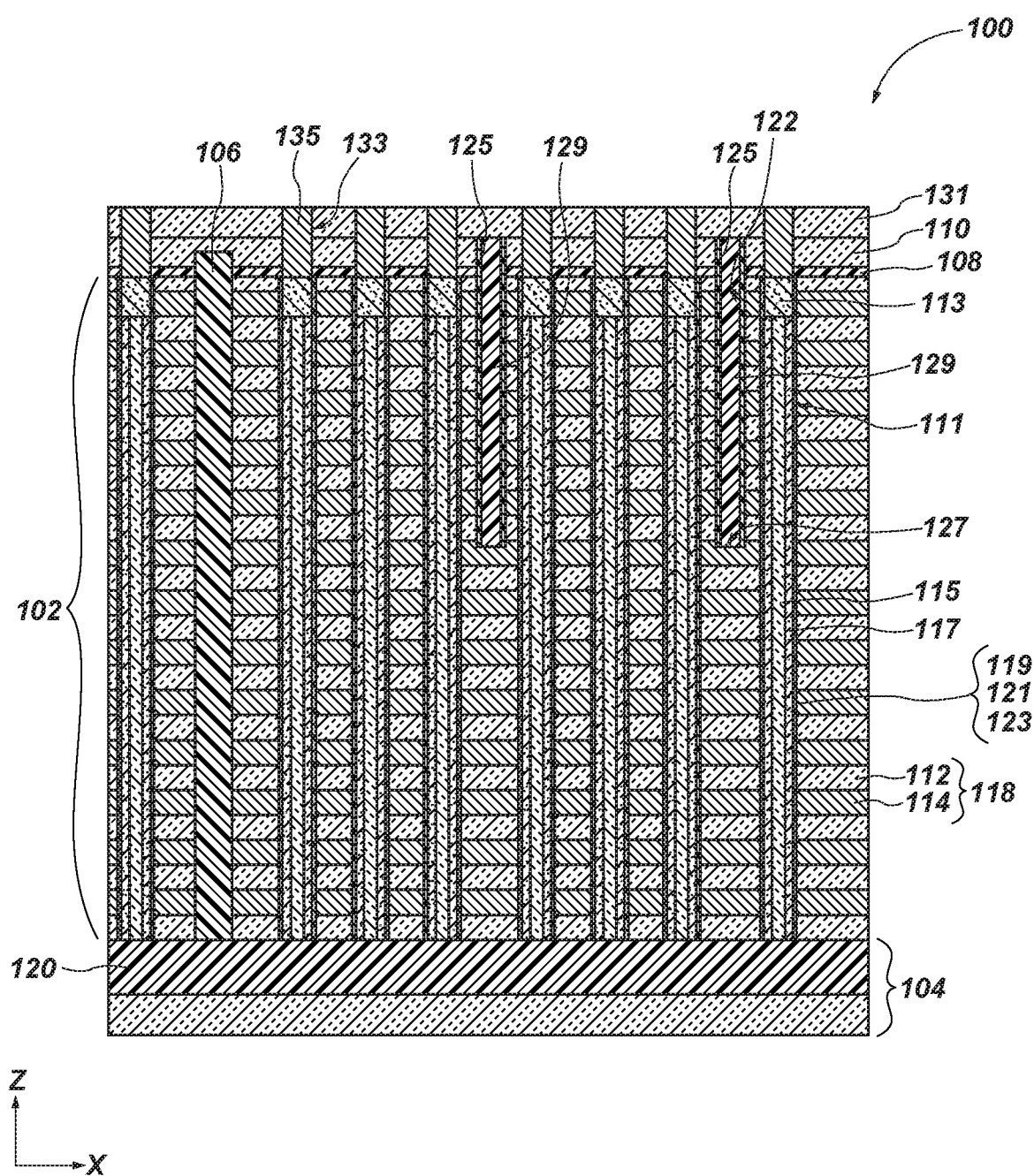

Referring to FIG. 1F, portions of the dielectric material 129 on or over an upper surface of the dielectric material 110 may be removed, while retaining additional portions of the dielectric material 129 with boundaries of the trenches 122 (FIG. 122). In some embodiments, the portions of the dielectric material 129 are removed via an abrasive planarization process (e.g., a chemical mechanical planarization (CMP) process). In other embodiments, the portions of the dielectric material 129 are removed via another suitable technique including, but not limited to, etching (e.g., dry etching, wet etching, vapor etching) or ion milling. Remaining portions of the dielectric material 129 may serve as dielectric barrier structures within some (e.g., two or more) upper tiers 118 of the stack structure 102.

Referring to FIG. 1G, an additional dielectric material 131 may be formed over the dielectric material 110 and over exposed portions of the dielectric material 129 and the liner material 125. In some embodiments, the additional dielectric material 131 comprises a spin-on dielectric material and formed by a spin coating process. In other embodiments, the additional dielectric material 131 may be formed by, for example, ALD, CVD, PVD, LPCVD, and PECVD. The additional dielectric material 131 may include one or more of the materials described above in regard to the dielectric material 110.

Subsequent to forming the additional dielectric material 131, portions of the additional dielectric material 131 and the dielectric material 110 may be removed to form recesses 133 (e.g., contact openings) within the additional dielectric material 131 and the dielectric material 110. The recesses 133 in the additional dielectric material 131 and the dielectric material 110 may be formed by conventional techniques, such as by a directional etch process (e.g., an anisotropic etch process, such as an anisotropic dry or wet etch process) that removes the additional dielectric material 131 and the dielectric material 110. By way of non-limiting example, the additional dielectric material 131 and the dielectric material 110 may be patterned by reactive ion etching (RIE), plasma etching, and/or another etching method. In some embodiments, the etch stop material 108 may at least partially stop the formation of the recesses 133 (e.g., stop an etch forming the recesses 133) at the etch stop material 108, and the etch stop material 108 may be removed via an additional etch (e.g., a punch etch, a cyclic punch). In some embodiments, the recesses 133 are formed to be substantially aligned with the conductive plugs 113 and the pillar structures 111 of the microelectronic device structure 100. For example, the recesses 133 may be formed in an array to match an array (e.g., orientation and position) of the conductive plugs 113 and the pillar structures 111.

Upon formation of the recesses 133, contact structures 135 may be formed within the recesses 133. In some embodiments, the contact structures 135 may include an electrically conductive material. For example, the contact structures 135 may include one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductively-doped semiconductor material (e.g., conductively-doped polysilicon, conductively-doped Ge, conductively-doped SiGe), and a conductive metal-containing material (e.g., a conductive metal nitride, a conductive metal silicide, a conductive metal carbide, a conductive metal oxide).

In some embodiments, the contact structures 135 may be formed via conventional methods such as, for example, spin coating, blanket coating, CVD, ALD, PEALD, PVD (including sputtering, evaporation, ionized PVD, and/or PECVD), or epitaxial growth. Additionally, excess material of the contact structures 135 (e.g., material of the contact structures 135 on an upper surface of the additional dielectric material 131) may be removed via an abrasive planarization process (e.g., a CMP process). In other embodiments, material of the contact structures 135 on an upper surface of the additional dielectric material 131 may be removed via another suitable technique including, but not limited to, etching (e.g., dry etching, wet etching, vapor etching) or ion milling. As will be recognized by one of ordinary skill in the art, the contact structures 135 may be formed and arrayed to contact bit lines (e.g., digit lines, data lines). The contact structures 135 may be coupled to the pillar structures 111 through the conductive plugs 113.

Referring to FIGS. 1A-1G together, the liner material 125 and dielectric material 129 (e.g., the dielectric barrier structure) may form at least a partial barrier within some (e.g., two or more) upper tiers 118 of the stack structure 102. For example, the liner material 125 and the dielectric material 129 may form an at least a partial barrier between select gate structures (e.g., upper select gate structures), such as SGDs within some of the upper tiers 118 of the stack structure 102. Horizontally neighboring electrically conductive structures 114 of one or more vertically upper tiers 118 of the stack structure 102 employed as upper select gates (e.g., SGDs) of the microelectronic device structure 100, and the liner material 125 and the dielectric material 129 may horizontally intervene between and electrically isolate horizontally one or more neighboring upper select gates (e.g., SGDs) of the microelectronic device structure 100. The liner material 125 and the dielectric material 129 may prevent undesirable current leakage and short circuits between horizontally neighboring upper select gates (e.g., SGDs) of the microelectronic device structure 100 that may otherwise occur if the trenches 122 (and, thus, the liner material 125 and the dielectric material 129) were not formed between the horizontally neighboring upper select gates.

As noted above, the liner material 125 may also provide a physical barrier between the electrically conductive structures 114 of upper tiers 118 of the stack structure 102 and the dielectric material 129. The liner material 125 may substantially impede (e.g., prevent) electrically conductive material (e.g., W) of the electrically conductive structures from oxidizing as a result of physical contact with the dielectric material 129. Oxidation of the electrically conductive structures 114 may otherwise effectuate relatively low effective threshold voltages for the microelectronic device structure 100. By impeding oxidation of the electrically conductive structures 114, the liner material 125 may improve (e.g., increase) the effective threshold voltages of the microelectronic device structure 100, and thus, may improve performance of the microelectronic device structure 100.

Additionally, the liner material 125 can reduce a likelihood of material of the contact structures 135 "falling off" the conductive plug 113, leaking into the trenches 122, and contacting the electrically conductive structures 114. When material of the contact structures 135 leaks into the trenches and contacts the electrically conductive structures 114. The resulting contact can cause undesirable current leakage and short circuits. In some embodiments, "falloff" can be at least partially caused by pillar structure 111 bending and/or misalignment during patterning processes for the formation of the contact structures 135. Etchant used in forming the recesses 133 can undesirably remove portions of the dielectric material 129 within the trenches 122, thereby permitting the material of the contact structures 135 to form within the trenches 122 and potentially contact the electrically conductive structures 114. Because the liner material 125 is formed at the boundaries of the trenches 122 and between the dielectric material 129 and the electrically conductive structures 114, the liner material 125 may prevent falloff of the material of the contact structures 135; or, in the event of falloff of the material of the contact structures 135, the liner material 125 may prevent the material of the contact structures 135 from contacting the electrically conductive structures 114. For example, the liner material 125 may not be removed during the removal processes to form the recesses 133 where the contact structures 135 are to be formed. For instance, one or more of the etchants or removal processes utilized to form the recesses 133 may be selective to the additional dielectric material 131, the dielectric material 110, and the etch stop material 108 and may not remove the liner material 125.

Furthermore, the liner material 125 can reduce a likelihood of voids within the tiers 118 causing blowouts and/or materials of the tiers 118 outgassing (e.g., releasing or giving off (a substance) as a gas or vapor) and causing blowouts. In particular, the liner material 125 may reduce any interaction between the dielectric material 129 and the materials of the tiers 118, which may reduce the likelihood of outgassing and blowouts during formation of the dielectric material 129.

In view of the foregoing, the liner material 125 may reduce defects within and improve performance of the microelectronic device structure 100. By reducing defects and improving performance, the liner material 125 and structure of the microelectronic device structure 100 described herein may improve yield and may increase profits.

Figure 2A:
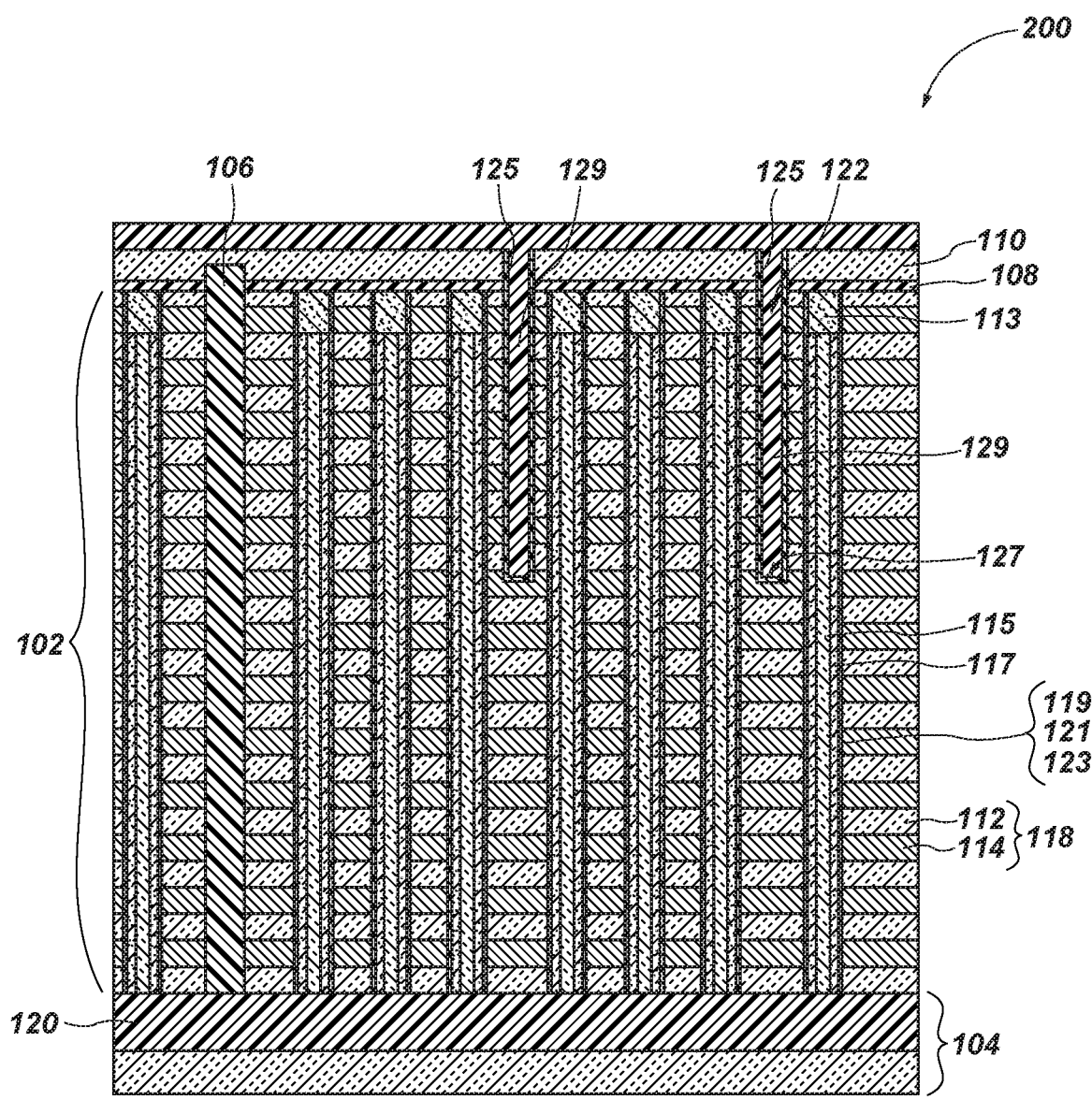
FIGS. 2A through 2C are a simplified, partial cross-sectional views illustrating a method of forming a microelectronic device, in accordance with additional embodiments of the disclosure.
Figure 2B:
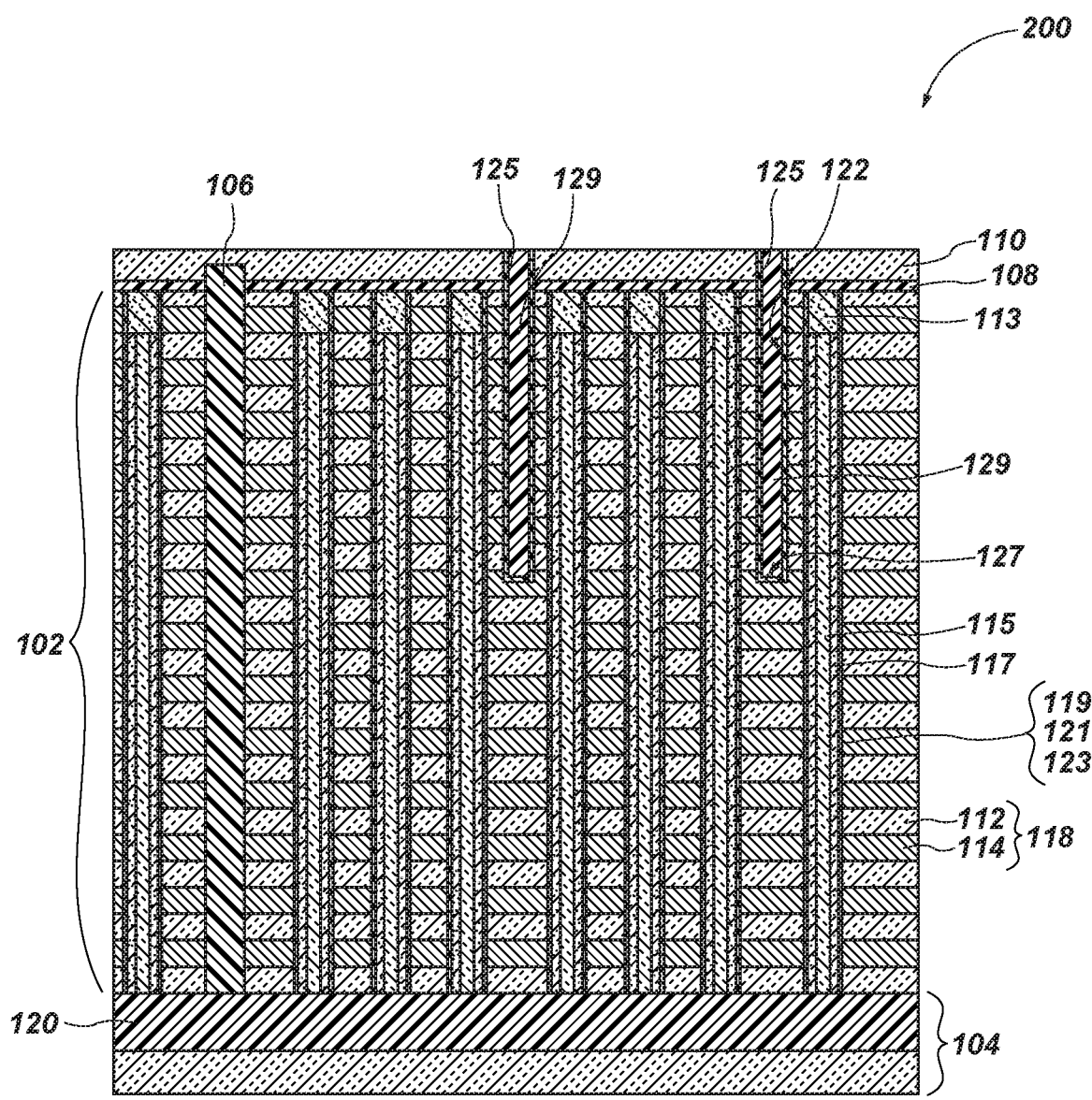
Figure 2C:
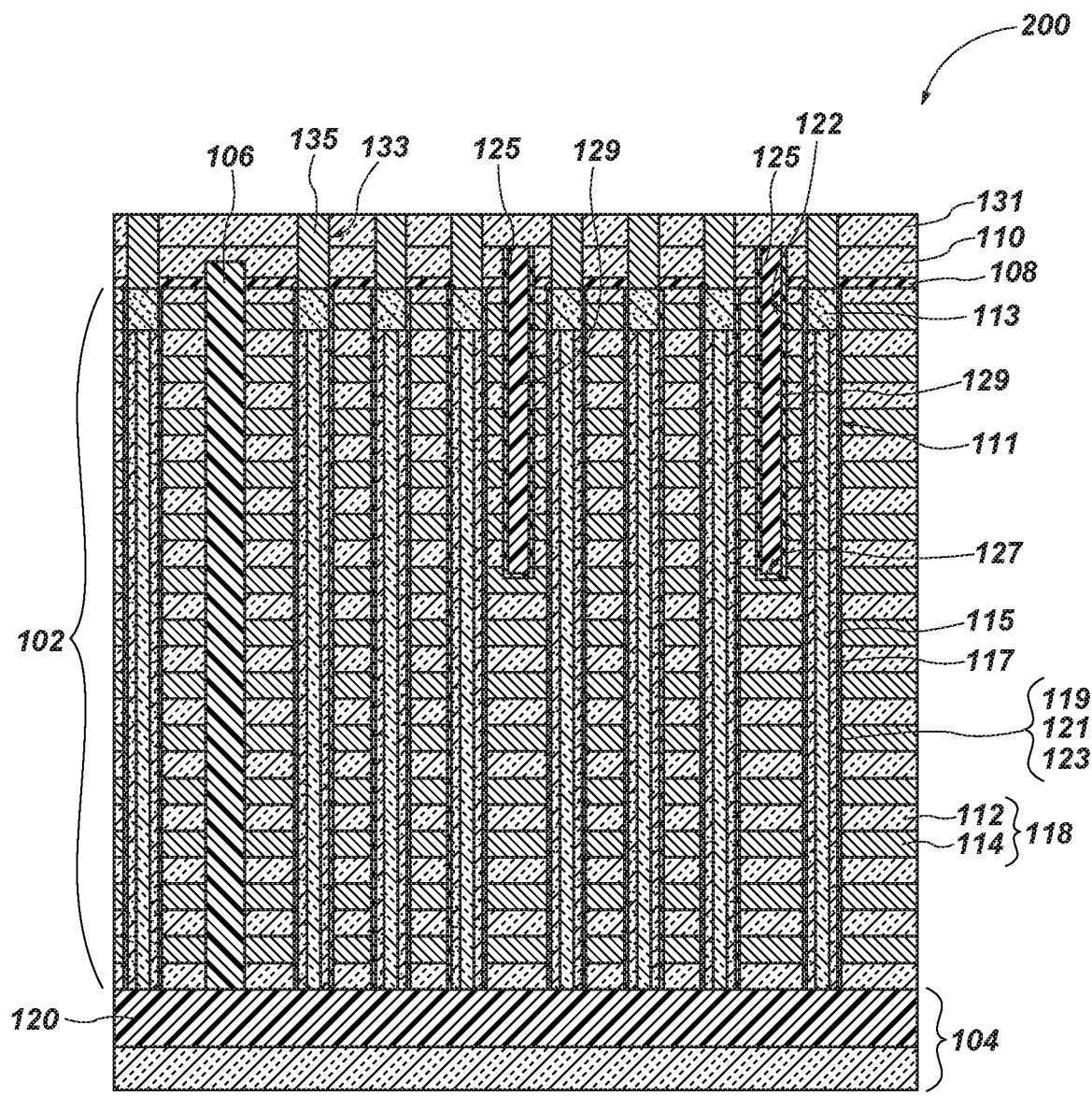

FIGS. 2A through 2C are simplified partial cross-sectional views illustrating embodiments of a method of forming a microelectronic device structure 200 (e.g., a memory device, such as a 3D NAND Flash memory device), according to additional embodiments of the disclosure. The method includes the same process acts as described above with reference to FIGS. 1A-1C, followed by the process acts illustrated in FIGS. 2A-2C.

Referring to FIG. 2A, subsequent to forming the liner material 125 on or over the upper surface of the dielectric material 110 and over surfaces of upper tiers 118 of the stack structure 102 defining the trenches 122, the dielectric material 129 may be formed (e.g., deposited) over the liner material 125 within the trenches 122 and over the liner material 125 on the dielectric material 110 without removing portions of the liner material 125, as described above in regard to FIG. 1D. The dielectric material 129 may include one or more of the materials described above with reference to FIG. 1E and may be formed by way of the processing acts previously described above with reference to FIG. 1E. For example, the dielectric material 110 may include at least one dielectric oxide material (e.g., an aluminum oxide).

Referring to FIG. 2B, portions of the dielectric material 129 and the liner material 125 on the upper surface of the dielectric material 110 may be removed. In some embodiments, the portions of the dielectric material 129 and the liner material 125 may be removed via an abrasive planarization process (e.g., a CMP process). In one or more embodiments, the portions of the dielectric material 129 may be removed by way of a first abrasive planarization process, and the liner material 125 on the upper surface of the dielectric material 110 may be removed by way of a second, different abrasive planarization process. In additional embodiments, the portions of the dielectric material 129 and the liner material 125 on the upper surface of the dielectric material 110 may be removed by way of a single abrasive planarization process. In some embodiments, one or more of the portions of the dielectric material 129 and the liner material 125 on the upper surface of the dielectric material 110 may be removed by way of another technique including, but not limited to, etching (e.g., dry etching, wet etching, vapor etching) or ion milling.

Referring to FIG. 2C, the additional dielectric material 131 may be formed over the dielectric material 110 and over exposed portions of the dielectric material 129 and the liner material 125 within the trenches 122. In some embodiments, the additional dielectric material 131 may be a spin-on dielectric material and may be formed by a spin coating process. In other embodiments, the additional dielectric material 131 may be formed by, for example, one or more of ALD, CVD, PVD, LPCVD, PECVD, and another deposition method. The additional dielectric material 131 may include one or more of the materials described above in regard to the dielectric material 110.

Subsequent to forming the additional dielectric material 131, portions of the additional dielectric material 131 and the dielectric material 110 may be removed to form recesses 133 within the additional dielectric material 131 and the dielectric material 110. The recesses 133 in the additional dielectric material 131 and the dielectric material 110 may be formed by conventional techniques, such as by a directional etch process (e.g., an anisotropic etch process, such as an anisotropic dry or wet etch process) that removes the additional dielectric material 131 and the dielectric material 110. By way of non-limiting example, the additional dielectric material 131 and the dielectric material 110 may be patterned by RIE, plasma etching, or another etching method. In some embodiments, the etch stop material 108 terminates formation of the recesses 133 at the etch stop material 108, and the etch stop material 108 may be removed by way of an additional etch (e.g., a punch etch, a cyclic punch). In some embodiments, the recesses 133 is formed to be at least substantially horizontally aligned with the conductive plugs 113 and the pillar structures 111 of the microelectronic device structure 100. The recesses 133 may be patterned in an array to match an array of the conductive plugs 113 and the pillar structures 111.

Upon formation of the recesses 133, contact structures 135 may be formed within the recesses 133. The contact structures 135 may be substantially similar to and may be formed in substantially the same manner as the contact structures 135 previously described with reference to FIG. 1G. The method described above in regard to FIGS. 1A-1C and FIGS. 2A-2C may result in liner material 125 remaining on surfaces 127 defining lower boundaries of the trenches 122. Additionally, the method described above in regard to FIGS. 1A-1C and FIGS. 2A-2C may reduce a number of processing steps required to form a microelectronic device structure (e.g., microelectronic device structure 200) in comparison to the method described above with reference to FIGS. 1A-1G. Furthermore, the liner material 125 and the dielectric material 129 of microelectronic device structure 200 may provide the same advantages described above with reference to FIGS. 1A-1G.

Figure 3:
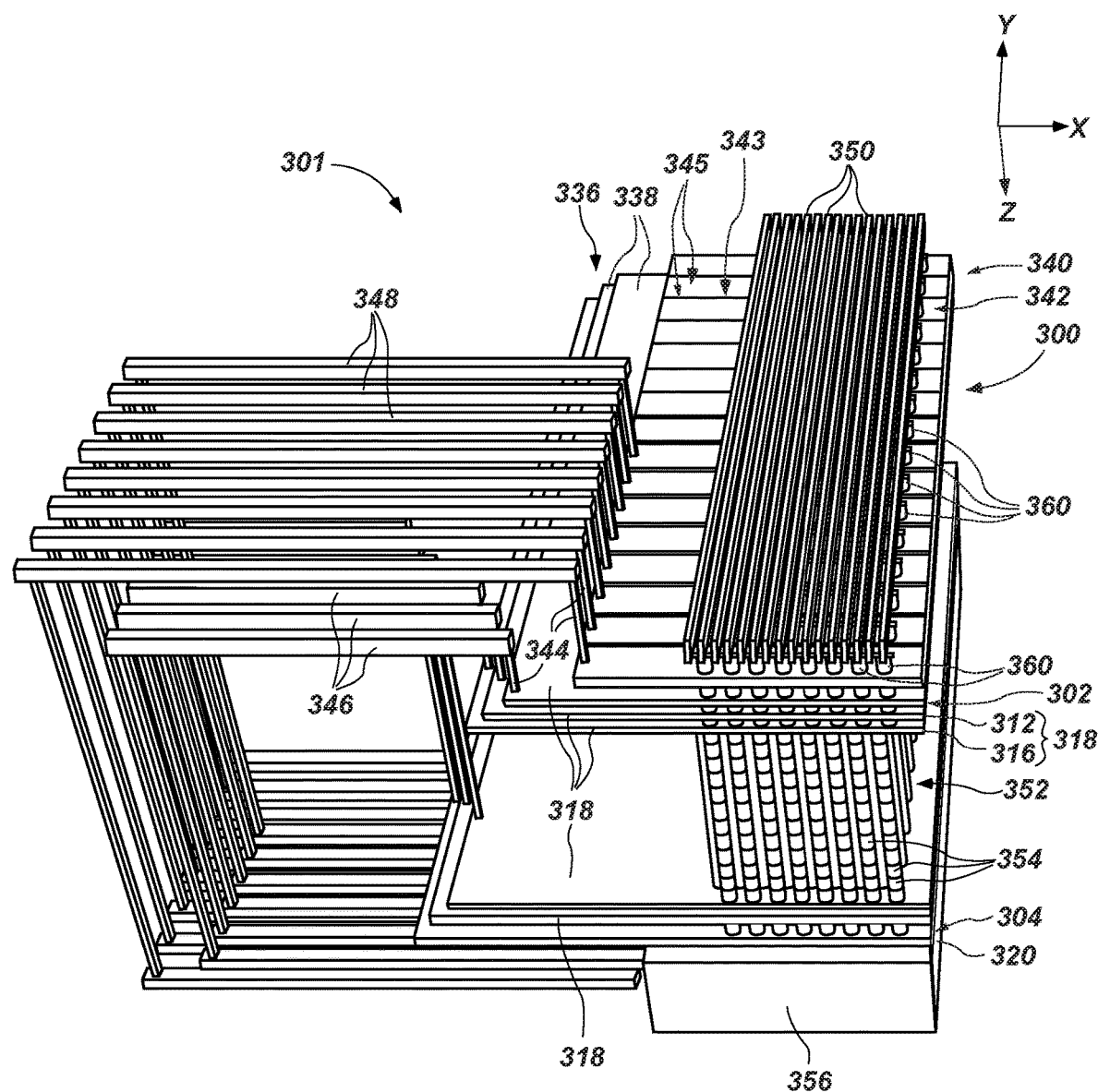
FIG. 3 is a partial cutaway perspective view of a microelectronic device, in accordance with embodiments of the disclosure.

FIG. 3 illustrates a partial cutaway perspective view of a portion of a microelectronic device 301 (e.g., a memory device, such as a dual deck 3D NAND Flash memory device) including a microelectronic device structure 300. The microelectronic device structure 300 may comprise one of the microelectronic device structures 100, 200 previously described herein following additional processing after the processing stage previously described with reference to FIG. 1G or FIG. 2C, respectively. As shown in FIG. 3, the microelectronic device structure 300 may include a stack structure 302 including tiers 318 of vertically alternating (e.g., in the Z-direction) electrically conductive structures 316 (e.g., corresponding to the electrically conductive structures 114 previously described within reference to FIGS. 1A-1G and 2A-2C) and insulative structures 312 (e.g., corresponding to the insulative structures 112 previously described with reference to FIGS. 1A-1G and 2A-2C), and horizontally divided (e.g., in the Y-direction) into multiple blocks 340 horizontally separated (e.g., in the Y-direction) from one another by filled slots 342 (e.g., slots filled with dielectric material); additional filled slots 343 (e.g., individually corresponding to the trenches 122 filled with the dielectric material 129 previously described with reference to FIGS. 1A-1G and 2A-2C) partially vertically extending (e.g., in the Z-direction) into each of the blocks 340 (and defining upper select gates, such as SGDs, of each of the blocks 340) and sub-dividing each of the blocks 340 into at least two sub-blocks 345; staircase structures 336 having steps 338 defined by edges (e.g., horizontal ends in the X-direction) of the tiers 318; contact structures 344 (e.g., access line contact structures, word line contact structures) connected to the steps 338 of the staircase structures 336; and a source tier 304 including a source structure 320 (e.g., corresponding to one of the source structures 120 previously described with reference to FIGS. 1A-1G and 2A-2C, respectively). The microelectronic device 301 also includes additional features (e.g., structures, devices) operatively associated with the microelectronic device structure 300, as described in further detail below.

The microelectronic device 301 may further include strings 352 of memory cells 354 vertically coupled to one another in series, access lines 346 (e.g., word lines), select lines 348, and data lines 350 (e.g., bit lines). The strings 352 of the memory cells 354 extend vertically and orthogonal to conductive lines and tiers (e.g., the source tier 304, the tiers 318 of the stack structure 302, the access lines 346, the select lines 348, the data lines 350) of the microelectronic device 301, and the contact structures 344 may electrically couple components to each other as shown (e.g., the access lines 346 and the select lines 348 to the tiers 318 of the stack structure 302 of the microelectronic device structure 300). The data lines 350 may be electrically coupled to the vertical strings 352 through conductive contact structures 360 (e.g., corresponding to the contact structures 135 previously described with reference to FIGS. 1A-1G and 2A-2C, respectively).

With continued reference to FIG. 3A, the microelectronic device 301 may also include a control unit 356 (e.g., a control device) positioned vertically below the strings 352 of memory cells 354. The control unit 356 may include including control logic devices configured to control various operations of other features (e.g., the strings 352 of memory cells 354) of the microelectronic device 301. By way of non-limiting example, the control unit 356 may include one or more (e.g., each) of charge pumps (e.g., VCCP charge pumps, VNEGWL charge pumps, DVC2 charge pumps), delay-locked loop (DLL) circuitry (e.g., ring oscillators), Vdd regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. In some embodiments, the control unit 356 is at least partially (e.g., substantially) positioned within horizontal boundaries (e.g., in the X-direction and the Y-direction) of a horizontal area occupied by the strings 352 of memory cells 354. The control unit 356 may, for example, be electrically coupled to the data lines 350, the source structure 320 of the source tier 304, the access lines 346, and select lines 348. In some embodiments, the control unit 356 includes CMOS (complementary metal-oxide-semiconductor) circuitry. In such embodiments, the control unit 356 may be characterized as having a "CMOS under Array" ("CuA") configuration.

Thus, in accordance with embodiments of the disclosure, a memory device comprises a stack structure, dielectric-filled trenches partially vertically extending through the stack structure, a staircase structure, a source tier, pillar structures, access line contact structures, data lines, an array of vertically extending strings of memory cells, access lines, and a control device. The stack structure comprises tiers each comprising at least one conductive structure and at least one insulating structure vertically adjacent the at least one conductive structure. The dielectric-filled trenches each comprise a lower portion, and an upper portion having one or more greater horizontal widths than the lower portion. The staircase structure has steps comprising edges of the tiers of the stack structure. The source tier underlies the stack structure and comprises a source plate, and discrete conductive structures separated from one another and the source plate. The pillar structures vertically extend through the stack structure and contact the discrete conductive structures of the source tier. The access line contact structures are on the steps of the staircase structure and horizontally alternate with some of the pillar structures. The data lines overlie the stack structure. The array of vertically extending strings of memory cells extends through the stack structure and is electrically connected to the source plate and the data lines. The access lines are electrically connected to the access line contact structures. The control device comprises CMOS circuitry vertically underlying the source tier and within horizontal boundaries of the array of vertically extending strings of memory cells. The control device is electrically coupled to the source plate, the data lines, and the access lines.

Figure 4:
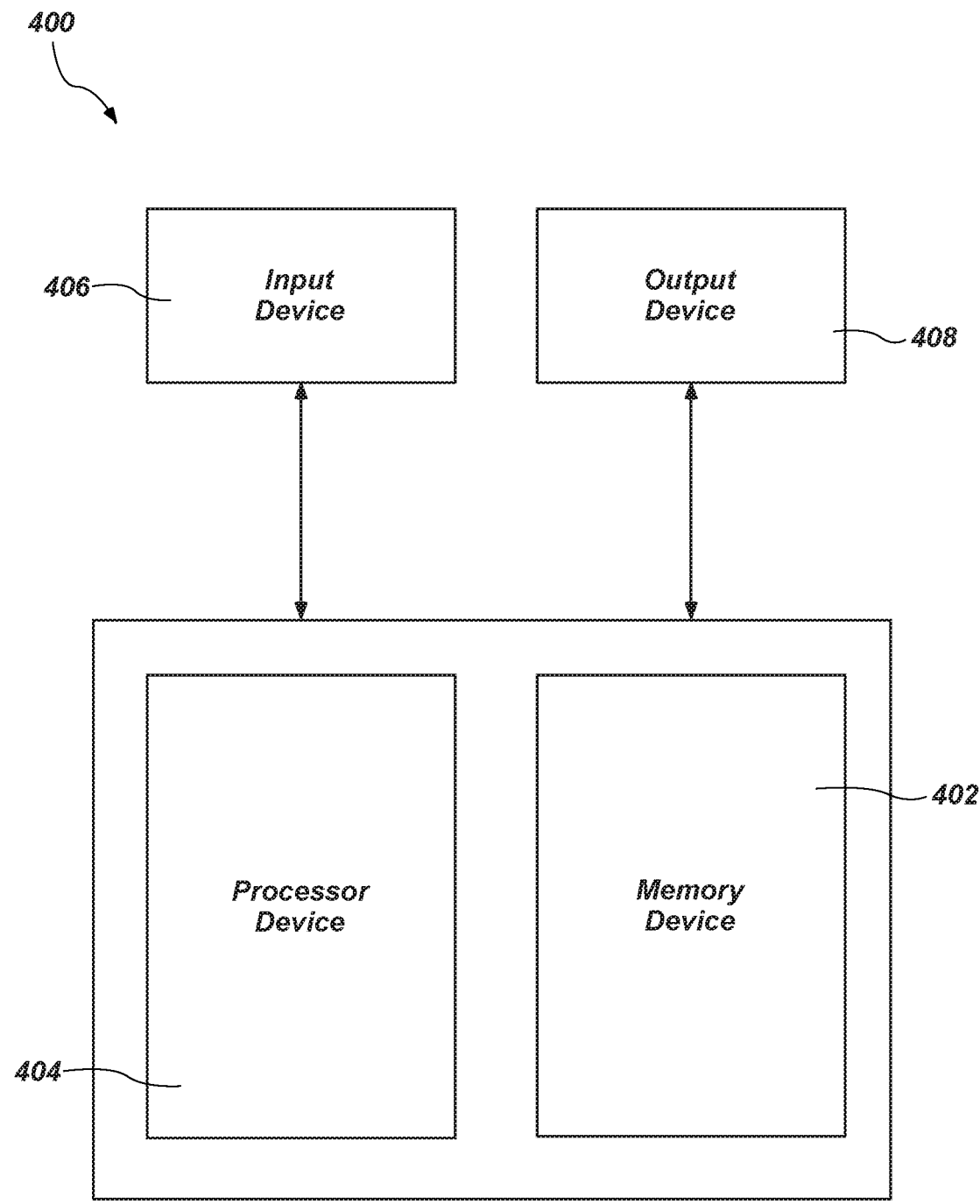
FIG. 4 is a schematic block diagram illustrating an electronic system, in accordance with embodiments of the disclosure.

Microelectronic device structures (e.g., the microelectronic device structure 300 previously described with reference to FIG. 3) and microelectronic devices (e.g., the microelectronic device 301 previously described with reference to FIG. 3) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, and/or a navigation device. The electronic system 400 includes at least one memory device 402. The memory device 402 may comprise, for example, an embodiment of one or more of a microelectronic device structure and a microelectronic device previously described herein. The electronic system 400 may further include at least one electronic signal processor device 404 (often referred to as a "microprocessor"). The electronic signal processor device 404 may, optionally, include an embodiment of one or more of a microelectronic device structure and a microelectronic device previously described herein. While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure and a microelectronic device previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising tiers each comprising a conductive structure and a dielectric structure vertically neighboring the conductive structure; trenches vertically extending completely through the stack structure and filled with dielectric material; additional trenches horizontally alternating with the trenches and vertically extending partially through the stack structure, at least one of the additional trenches having non-planar horizontal boundaries and filled with additional dielectric material; a source tier vertically below the stack structure and comprising a source structure and discrete conductive structures electrically isolated from one another and the source structure; and conductive pillars vertically extending through the stack structure to the discrete conductive structures of the source tier.

The methods, structures (e.g., the microelectronic device structures 100, 200, 300), devices (e.g., the microelectronic device 301), and systems (e.g., the electronic system 400) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the methods and configurations of the disclosure may reduce the risk undesirable current leakage and short circuits (e.g., SGD-SGD current leakage and short circuits) as compared to conventional methods and configurations.

With reference to FIG. 5, depicted is a processor-based system 500. The processor-based system 500 may include various microelectronic devices and microelectronic device structures (e.g., microelectronic devices and microelectronic device structures including one or more of the microelectronic device 301 or the microelectronic device structures 100, 200, 300) manufactured in accordance with embodiments of the disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices and microelectronic device structures (e.g., microelectronic devices and microelectronic device structures including one or more of the microelectronic device 201 or the microelectronic device structure 100, 200) manufactured in accordance with embodiments of the disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices and microelectronic device structures (e.g., the microelectronic device 201 and the microelectronic device structures 100, 200, 300) described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices and microelectronic device structures (e.g., the microelectronic device 201 and the microelectronic device structure 100, 200) described above, or a combination thereof.

Embodiments of the disclosure include methods of forming a microelectronic device. The methods include forming a microelectronic device structure. The microelectronic device structure includes a stack structure comprising insulative structures and electrically conductive structures vertically alternating with the insulative structures, pillar structures extending vertically through the stack structure, an etch stop material vertically overlaying the stack structure, and a first dielectric material vertically overlying the etch stop material. The methods further include removing portions of the first dielectric material, the etch stop material, and an upper region of the stack structure to form a trench interposed between horizontally neighboring groups of the pillar structures, forming a liner material within the trench, and substantially filling a remaining portion of the trench with a second dielectric material to form a dielectric barrier structure.

Some embodiments of the disclosure include a microelectronic device. The microelectronic device includes a stack structure comprising a vertically alternating sequence of electrically conductive structures and insulating structures arranged in tiers, each of the tiers including one of the electrically conductive structures and one of the insulating structures. The microelectronic device further includes pillar structures extending vertically through the tiers of the stack structure and filled trenches vertically extending through an upper portion of the stack structure, each filled trench interposed between two horizontally neighboring groups of the pillar structures and including a liner material horizontally adjacent sidewalls of the stack structure defining the trenches and a first dielectric material horizontally surrounded by the liner material.

Additional embodiments of the disclosure include a memory device including a stack structure comprising tiers each comprising at least one conductive structure and at least one insulating structure vertically adjacent the at least one conductive structure, a staircase structure having steps comprising edges of the tiers of the stack structure, a source tier underlying the stack structure and comprising a source plate, cell pillar structures vertically extending through the stack structure and contacting the source plate of the source tier, trenches partially vertically extending through the stack structure, each of the trenches being formed between two sets of the cell pillar structures horizontally neighboring one another and individually including a dielectric nitride material horizontally adjacent the stack structure and a dielectric oxide material horizontally adjacent the dielectric nitride material, access line contact structures on the steps of the staircase structure, data lines overlying the stack structure, access lines electrically connected to the access line contact structures, and a control device comprising CMOS circuitry vertically underlying the source tier and within horizontal boundaries of the array of pillar structures, the control device electrically coupled to the source plate, the data lines, and the access lines.

Embodiments of the disclosure include an electronic system. The electronic system includes an input device, an output device, a processor device operably coupled to the input device and the output device, and a memory device operably coupled to the processor device and including a microelectronic device structure. The microelectronic device structure including a stack structure comprising vertically alternating sequence of electrically conductive structures and insulating structures arranged in tiers, each of the tiers comprising one of the electrically conductive structures and one of the insulating structures, pillar structures extending vertically through the tiers of the stack structure, the pillar structures and the electrically conductive structures forming at least portions of memory cells, filled trenches vertically extending through an upper portion of the stack structure, each filled trench interposed between two horizontally neighboring groups of the pillar structures, each of the filled trenches including a liner material horizontally adjacent sidewalls of the stack structure defining the trenches, the liner material comprising a nitride and a dielectric material horizontally adjacent the liner material, the dielectric material being at least partially surrounded by the liner material on at least two opposing sides of the dielectric material, the dielectric material comprising an oxide material and forming a dielectric barrier structure.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
 a stack structure comprising a vertically alternating sequence of electrically conductive structures and insulating structures arranged in tiers, each of the tiers comprising one of the electrically conductive structures and one of the insulating structures;
 pillar structures extending vertically through the tiers of the stack structure; and
 filled trenches vertically extending through an upper portion of the stack structure, each filled trench interposed between two horizontally neighboring groups of the pillar structures and comprising:
  a liner material horizontally adjacent sidewalls of the stack structure defining the trenches; and
  a first dielectric material horizontally surrounded by the liner material.

2. The microelectronic device of claim 1, further comprising:
 an etch stop material overlying the stack structure; and
 a second dielectric material vertically overlying the etch stop material,
 wherein the filled trenches also vertically extend through the first dielectric material and the etch stop material.

3. The microelectronic device of claim 1, wherein the liner material comprises a dielectric nitride material.

4. The microelectronic device of claim 3, wherein the dielectric nitride material comprises a silicon nitride.

5. The microelectronic device of claim 1, wherein the first dielectric material comprises dielectric oxide material.

6. The microelectronic device of claim 5, wherein the dielectric oxide material comprises aluminum oxide.

7. The microelectronic device of claim 1, wherein the liner material of each filled trench is interposed between the first dielectric material and the electrically conductive structures of the tiers of the upper portion of the stack structure.

8. The microelectronic device of claim 1, wherein the liner material has a thickness within a range of about 3 nm to about 7 nm.

9. The microelectronic device of claim 1, wherein the electrically conductive structures comprise tungsten.

10. The microelectronic device of claim 1, further comprising:
 contact structures coupled to the pillar structures;
 a staircase structure having steps comprising edges of at least some of the tiers of the stack structure; and
 additional contact structures on the steps of the staircase structure and horizontally alternating with at least some of the contact structures.

11. The microelectronic device of claim 1, wherein the pillar structures form at least portions of memory cells.

12. A memory device, comprising:
 a stack structure comprising tiers each comprising at least one conductive structure and at least one insulating structure vertically adjacent the at least one conductive structure;
 a staircase structure having steps comprising edges of the tiers of the stack structure;
 a source tier underlying the stack structure and comprising a source plate;
 cell pillar structures vertically extending through the stack structure and contacting the source plate of the source tier;

trenches partially vertically extending through the stack structure, each of the trenches being formed between two sets of the cell pillar structures horizontally neighboring one another and individually comprising:
a dielectric nitride material horizontally adjacent the stack structure; and
a dielectric oxide material horizontally adjacent the dielectric nitride material;
access line contact structures on the steps of the staircase structure;
data lines overlying the stack structure;
access lines electrically connected to the access line contact structures; and
a control device comprising CMOS circuitry vertically underlying the source tier and within horizontal boundaries of an array of pillar structures, the control device electrically coupled to the source plate, the data lines, and the access lines.

13. The memory device of claim 12, wherein the dielectric nitride material comprises $Si_3N_4$.

14. The memory device of claim 13, wherein the dielectric nitride material has a thickness of about 5 nm.

15. The memory device of claim 12, wherein the dielectric oxide material comprises $SiO_2$.

16. An electronic system, comprising:
an input device;
an output device;
a processor device operably coupled to the input device and the output device; and
a memory device operably coupled to the processor device and comprising a microelectronic device structure comprising:
a stack structure comprising vertically alternating sequence of electrically conductive structures and insulating structures arranged in tiers, each of the tiers comprising one of the electrically conductive structures and one of the insulating structures;
pillar structures extending vertically through the tiers of the stack structure, the pillar structures and the electrically conductive structures forming at least portions of memory cells;
filled trenches vertically extending through an upper portion of the stack structure, each filled trench interposed between two horizontally neighboring groups of the pillar structures, each of the filled trenches comprising:
a liner material horizontally adjacent sidewalls of the stack structure defining the trenches, the liner material comprising a nitride; and
a dielectric material horizontally adjacent the liner material, the dielectric material being at least partially surrounded by the liner material on at least two opposing sides of the dielectric material, the dielectric material comprising an oxide material and forming a dielectric barrier structure.

17. The electronic system of claim 16, wherein the memory device comprises a multi-deck 3D NAND Flash memory device.

* * * * *